United States Patent
Lin

(10) Patent No.: US 12,009,022 B2
(45) Date of Patent: Jun. 11, 2024

(54) SEMICONDUCTOR DEVICE FOR MEMORY DEVICE

(71) Applicant: NANYA TECHNOLOGY CORPORATION, New Taipei (TW)

(72) Inventor: Shih-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 161 days.

(21) Appl. No.: 17/885,565

(22) Filed: Aug. 11, 2022

(65) Prior Publication Data
US 2024/0055041 A1   Feb. 15, 2024

(51) Int. Cl.
| | |
|---|---|
| G11C 11/4074 | (2006.01) |
| G11C 7/10 | (2006.01) |
| H03L 5/00 | (2006.01) |
| G11C 5/14 | (2006.01) |

(52) U.S. Cl.
CPC .......... *G11C 11/4074* (2013.01); *G11C 7/109* (2013.01); *G11C 5/147* (2013.01)

(58) Field of Classification Search
CPC ...... G11C 11/4074; G11C 5/147; G11C 7/109
USPC ............... 365/226, 189.09; 307/31
See application file for complete search history.

(56) References Cited

U.S. PATENT DOCUMENTS

| | | | | |
|---|---|---|---|---|
| 6,166,990 | A * | 12/2000 | Ooishi | G11C 11/4076 365/194 |
| 7,617,335 | B2 | 11/2009 | Choi | |
| 7,791,966 | B2 | 9/2010 | Imai | |
| 7,996,705 | B2 | 8/2011 | Takeuchi | |
| 2001/0055229 | A1* | 12/2001 | Koike | G11C 11/22 365/200 |
| 2004/0170067 | A1* | 9/2004 | Kashiwazaki | G11C 5/14 365/189.09 |
| 2009/0045320 | A1* | 2/2009 | Xu | H04N 25/70 250/214 R |
| 2009/0231940 | A1* | 9/2009 | Wu | G11C 29/025 365/226 |
| 2022/0059148 | A1 | 2/2022 | Kim et al. | |

OTHER PUBLICATIONS

"Office Action of Taiwan Counterpart Application", issued on Aug. 28, 2023, p. 1-p. 3.

* cited by examiner

*Primary Examiner* — Ly D Pham
(74) *Attorney, Agent, or Firm* — JCIPRNET

(57) ABSTRACT

A semiconductor device can be applied to a memory device. The semiconductor device of the disclosure includes a voltage sensor, a convertor and a command/address on-die-termination (CA_ODT) circuit. The voltage sensor receives a voltage setting command, and sense a voltage level of the voltage setting command to generate a sensing signal. The convertor generates a setting signal in response to the sensing signal. The CA_ODT circuit generates a power voltage for the memory device in response to the setting signal, wherein a voltage level of the power voltage corresponds to the voltage level of the voltage setting command.

11 Claims, 5 Drawing Sheets

SEMICONDUCTOR DEVICE FOR MEMORY DEVICE

BACKGROUND

Technical Field

The disclosure generally relates to a semiconductor device, and more particularly to a semiconductor device for a memory device.

Description of Related Art

As area of a memory device getting more smaller, some functions and pins are integrated together. Some ODT pins are removed. Some functions must be designed on the other pins.

Some operations (such as a power-up operation) of the memory device are performed by at least two power voltages at different time. However, JEDEC does not significant define the operation when some ODT pins are removed. Therefore, it is necessary to provide a more efficient operation to switch the at least two power voltage.

SUMMARY

The disclosure provides a semiconductor device capable of providing at least two powers immediately and sequentially to a memory device.

The semiconductor device of the disclosure includes a voltage sensor, a convertor and a command/address on-die-termination (CA_ODT) circuit. The voltage sensor receives a voltage setting command, and sense a voltage level of the voltage setting command to generate a sensing signal. The convertor is coupled to the voltage sensor. The convertor generates a setting signal in response to the sensing signal. The CA_ODT circuit is coupled between the convertor and the memory device. The CA_ODT circuit generates a power voltage for the memory device in response to the setting signal. A voltage level of the power voltage corresponds to the voltage level of the voltage setting command.

Based on the above description, the voltage sensor senses the voltage level of the voltage setting command to generate the sensing signal. The convertor sets the CA_ODT circuit in response to the sensing signal, so that the CA_ODT circuit generates the power voltage for the memory device. The voltage level of the power voltage corresponds to the voltage level of the voltage setting command. Therefore, the semiconductor device provides at least two powers immediately and sequentially to the memory device based on the voltage level of the voltage setting command.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

Figure 1:
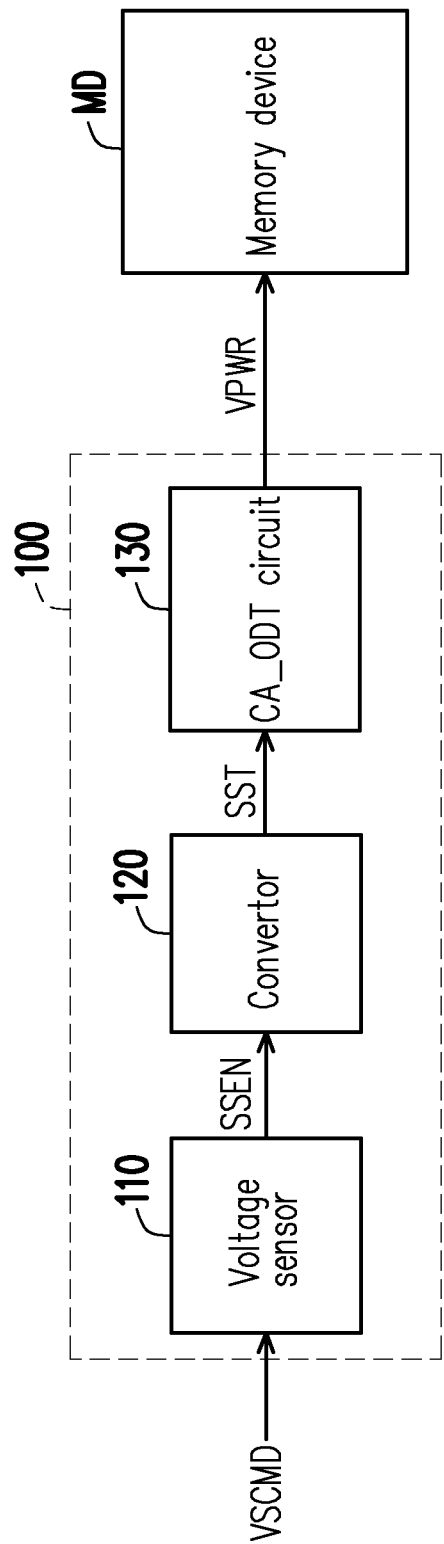
FIG. 1 illustrates a schematic diagram of a semiconductor device according to a first embodiment of the disclosure.

Referring to FIG. 1, FIG. 1 illustrates a schematic diagram of a semiconductor device according to a first embodiment of the disclosure. In the embodiment, the semiconductor device 100 is applicable to driving a memory device MD. The semiconductor device 100 includes a voltage sensor 110, a convertor 120 and a command/address on-die-termination (CA_ODT) circuit 130. The voltage sensor 110 receives a voltage setting command VSCMD, and senses a voltage level of the voltage setting command VSCMD to generate a sensing signal SSEN. The convertor 120 is coupled to the voltage sensor 110. The convertor 120 generates a setting signal SST in response to the sensing signal SSEN. The CA_ODT circuit 130 is coupled between the convertor 120 and the memory device MD. The CA_ODT circuit 130 generates a power voltage VPWR in response to the setting signal SST. The CA_ODT circuit 130 provides the power voltage VPWR to the memory device MD. For example, the power voltage VPWR is used to drive a memory controller and/or at least one memory array of the memory device MD. In the embodiment, a voltage level of the power voltage VPWR corresponds to the voltage level of the voltage setting command VSCMD.

It should be noted, the voltage sensor 110 senses the voltage level of the voltage setting command VSCMD to generate the sensing signal SSEN. The convertor 120 sets the CA_ODT circuit 130 in response to the sensing signal SSEN. The CA_ODT circuit 130 provides the power voltage VPWR to the memory device MD. The voltage level of the power voltage VPWR corresponds to the voltage level of the voltage setting command VSCMD. Therefore, the semiconductor device 100 provides at least two different powers immediately and sequentially to the memory device based on the voltage level of the voltage setting command VSCMD.

Besides, the semiconductor device 100 provides the power voltage VPWR to the memory device MD through the CA_ODT circuit 130. Therefore, a design and a process of the memory device MD does not need to be changed. The semiconductor device 100 performs some operations (such as a power-up operation) of the memory device MD based on at least two power voltages at different time through the CA_ODT circuit 130.

For ease of description, the present embodiment takes two different voltage levels of the voltage setting command VSCMD as an example. The number of different voltage levels of the disclosure may be plurality, and is not limited to the present embodiment.

For example, the memory device MD is any type of dynamic random access memory (DRAM) module or any type of DRAM chip.

In the embodiment, the CA_ODT circuit 130 may be set as a CA_ODT pin to reduce the reflection signal during a writing operation.

Figure 2:
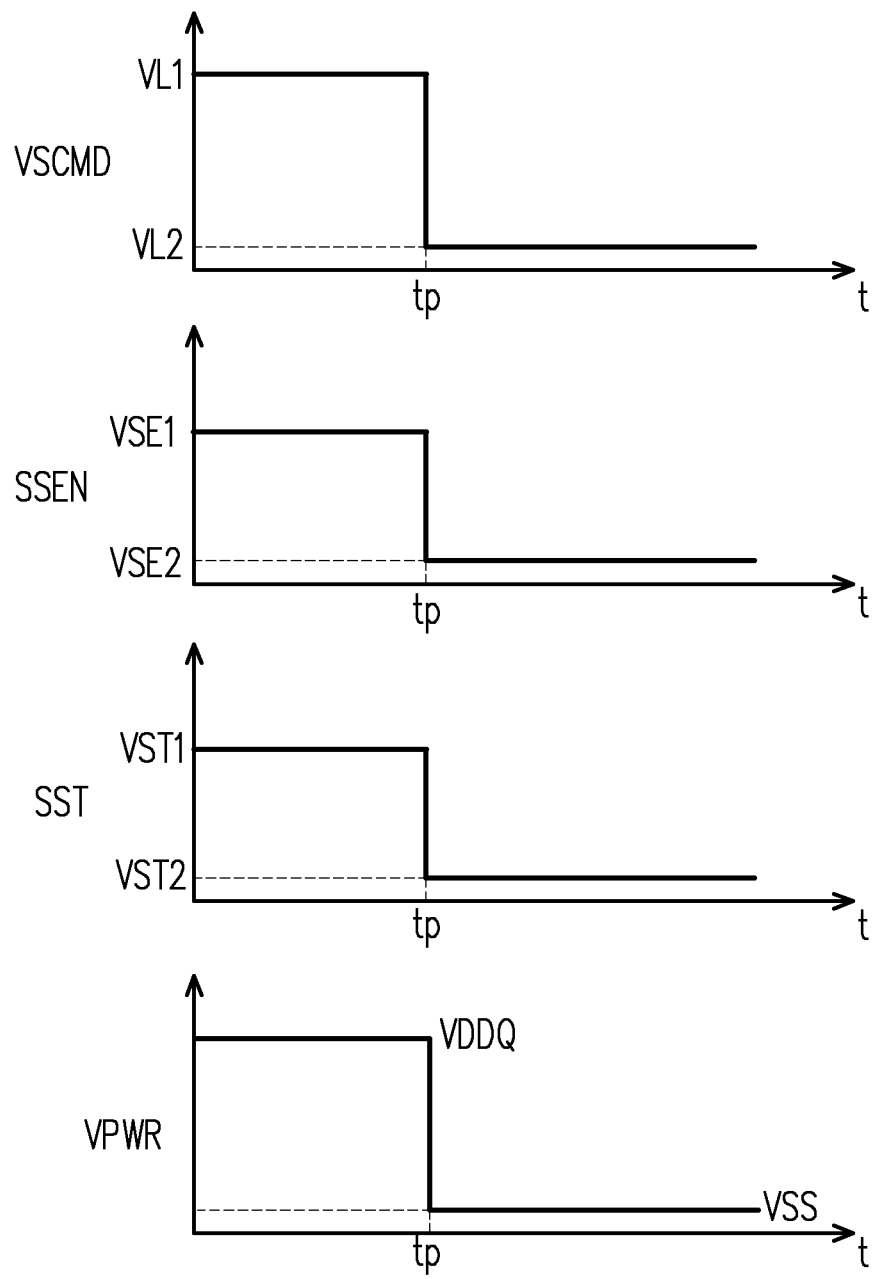
FIG. 2 illustrates a timing diagram of a voltage setting command, a sensing signal, a setting signal and a power voltage according to an embodiment of the disclosure.

For example, referring to FIG. 1 and FIG. 2, FIG. 2 illustrates a timing diagram of a voltage setting command, a sensing signal, a setting signal and a power voltage according to an embodiment of the disclosure. In the embodiment, when the voltage setting command VSCMD has a first voltage level VL1, the voltage sensor 110 generates the sensing signal SSEN having a first sensing value VSE1 in response to the first voltage level VL1. The convertor 120 converts the sensing signal SSEN having the first sensing value VSE1 to the setting signal SST having the first setting value VST1. The CA_ODT circuit 130 generates a power voltage VPWR as a high power voltage (For example, a high reference voltage VDD or VDDQ) in response to the setting signal SST having the first setting value VST1.

At a time point tp, the voltage setting command VSCMD has a second voltage level VL2. The voltage sensor 110 generates the sensing signal SSEN having a second sensing value VSE2 in response to the second voltage level VL2. The convertor 120 converts the sensing signal SSEN having the second sensing value VSE2 to the setting signal SST having the second setting value VST2. The CA_ODT circuit 130 generates a power voltage VPWR as a low power voltage (For example, a low reference voltage VSS) in response to the setting signal SST having the second setting value VST2.

In the embodiment, each of the first sensing value VSE1, the second sensing value VSE2, the first setting value VST1 and the second setting value VST2 may be a voltage level, a digital value or a logic value.

In the embodiment, the convertor 120 may be implemented by any type of signal converting circuit (such as an analog-to-digital converter), voltage shifter, encoder, decoder or buffer.

When the voltage level of the voltage setting command VSCMD is changed, the voltage level of the power voltage VPWR is changed correspondingly. In other words, when the voltage level of the voltage setting command VSCMD is the first voltage level VL1, the CA_ODT circuit 130 generates the power voltage VPWR as the high power voltage. When the voltage level of the voltage setting command VSCMD is the second voltage level VL2, the CA_ODT circuit 130 generates the power voltage VPWR as the low power voltage.

Figure 3:
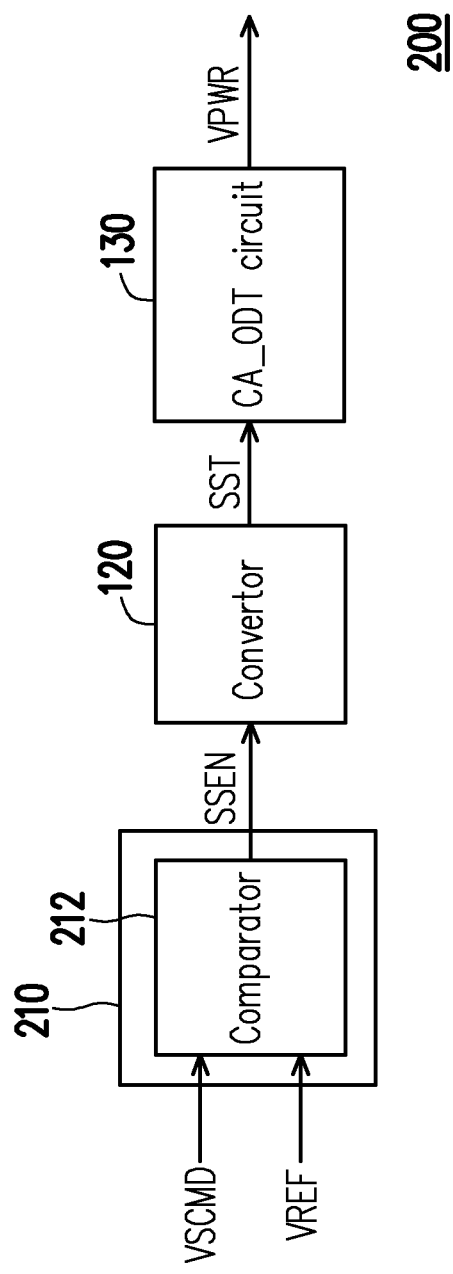
FIG. 3 illustrates a schematic diagram of a semiconductor device according to a second embodiment of the disclosure.

Referring to FIG. 3, FIG. 3 illustrates a schematic diagram of a semiconductor device according to a second embodiment of the disclosure. In the embodiment, the semiconductor device 200 includes a voltage sensor 210, the convertor 120 and the CA_ODT circuit 130. The convertor 120 and the CA_ODT circuit 130 can be inferred by referring to the relevant description of the FIG. 1 and FIG. 2, which is not repeated hereinafter.

In the embodiment, the voltage sensor 210 includes a comparator 212. The comparator 212 receive the voltage setting command VSCMD and a reference voltage VREF. The comparator 212 compares the voltage setting command VSCMD with the reference voltage VREF to generate the sensing signal SSEN. The comparator 212 provides the sensing signal SSEN to the convertor 120. For example, when the voltage level of the voltage setting command VSCMD is higher than the voltage level of the reference voltage VREF, the comparator 212 may generate the sensing signal SSEN having a first sensing value (such as the first sensing value VSE1 as shown in FIG. 2). On the other hand, when the voltage level of the voltage setting command VSCMD is lower than the voltage level of the reference voltage VREF, the comparator 212 generates the sensing signal SSEN having a second sensing value (such as the second sensing value VSE2 as shown in FIG. 2).

Figure 4:
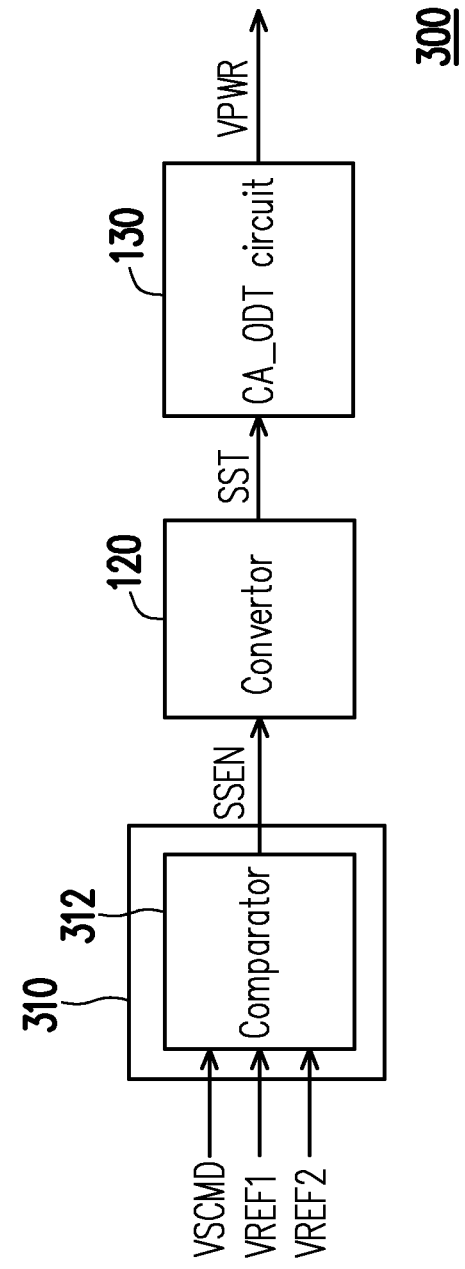
FIG. 4 illustrates a schematic diagram of a semiconductor device according to a third embodiment of the disclosure.

Referring to FIG. 4, FIG. 4 illustrates a schematic diagram of a semiconductor device according to a third embodiment of the disclosure. In the embodiment, the semiconductor device 300 includes a voltage sensor 310, the convertor 120 and the CA_ODT circuit 130. The convertor 120 and the CA_ODT circuit 130 can be inferred by referring to the relevant description of the FIG. 1 and FIG. 2, which is not repeated hereinafter.

In the embodiment, the voltage sensor 310 includes a comparator 312. The comparator 313 receive the voltage setting command VSCMD and reference voltages VREF1 and VREF2. The comparator 312 compares the voltage setting command VSCMD with the reference voltages VREF1 and VREF2 to generate the sensing signal SSEN.

Figure 5:
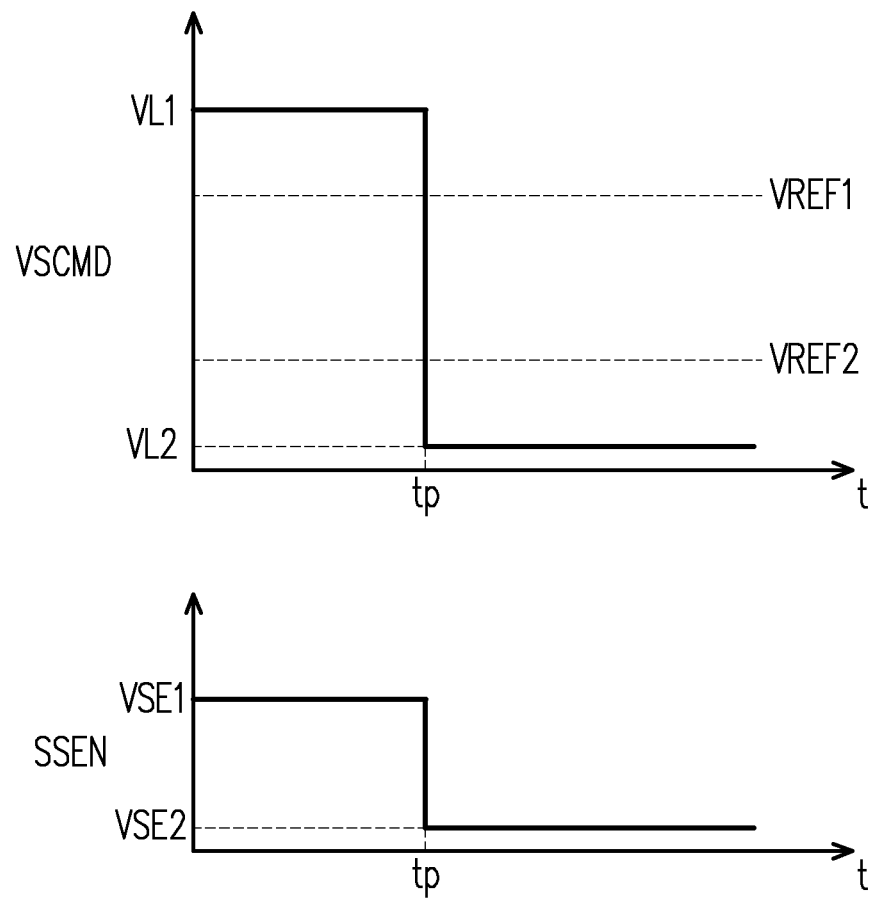
FIG. 5 illustrates a timing diagram of a voltage setting command and a sensing signal according to an embodiment of the disclosure.

For example, referring to FIG. 4 and FIG. 5, FIG. 5 illustrates a timing diagram of a voltage setting command VSCMD and a sensing signal SSEN according to an embodiment of the disclosure. In the embodiment, a voltage level of the reference voltage VREF1 is higher than a voltage level of the reference voltage VREF2. When the voltage level VL1 of the voltage setting command VSCMD is higher than the voltage level of the reference voltage VREF1, the comparator 312 generates the sensing signal SSEN having a first sensing value VSE1.

On the other hand, when the voltage level VL2 of the voltage setting command VSCMD is lower than the voltage level of the reference voltage VREF2, the comparator 312 generates the sensing signal SSEN having a second sensing value VSE2.

Besides, when a voltage level of the voltage setting command VSCMD is lower than the voltage level of the reference voltage VREF1 and high than the voltage level of the reference voltage VREF1, the comparator 312 may maintain the sensing value of the sensing signal SSEN. Therefore, the comparator 312 may decrease a fluctuation of the sensing value of the sensing signal SSEN when the voltage level of the voltage setting command VSCMD is transited between the voltage levels VL1 and VL2.

Figure 6:
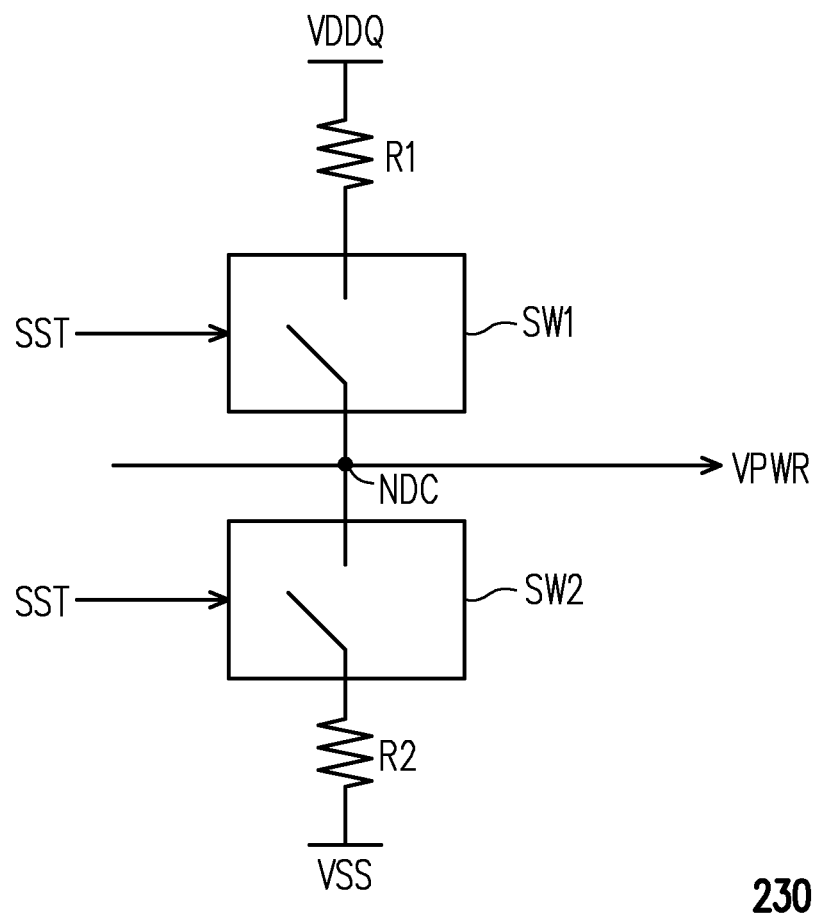
FIG. 6 illustrates a schematic diagram of a CA_ODT circuit according to an embodiment of the disclosure.

Referring to FIG. 2 and FIG. 6, FIG. 6 illustrates a schematic diagram of a CA_ODT circuit according to an embodiment of the disclosure. In the embodiment, the CA_ODT circuit 230 provides a first configuration when the setting signal SST has the first setting value VST1 and generate the power voltage VPWR having the first voltage level based on the first configuration. The CA_ODT circuit 230 provides a second configuration when the setting signal SST has a second setting value VST2 and generate the power voltage VPWR having the second voltage level based on the second configuration.

In the embodiment, the CA_ODT circuit comprises a first switch SW1 and a second switch SW2. A first terminal of the first switch SW1 is coupled to a high reference voltage VDDQ. A second terminal of the first switch SW1 is coupled to a power input node NDC coupled to the memory device MD. A control terminal of the first switch SW1 receives the setting signal SST. A first terminal of the second switch SW2 is coupled to the power input node NDC. A second terminal of the second switch SW2 is coupled to a low reference voltage VSS. A control terminal of the second switch SW2 receives the setting signal SST.

Detailly, the CA_ODT circuit further comprises resistors R1, R2. The first switch SW1 and the resistor R1 are connected in series between the high reference voltage VDDQ and power input node NDC. The second switch SW2 and the resistor R2 are connected in series between the low reference voltage VSS and power input node NDC. For example, the resistor R1 is connected between the high reference voltage VDDQ and the first terminal of the first switch SW1. The resistor R2 is connected between the low reference voltage VSS and the second terminal of the second switch SW2.

In the embodiment, when the setting signal SST has the first setting value VST1, the CA_ODT circuit 230 turns on the first switch SW1 and turns off the second switch SW2. Therefore, the CA_ODT circuit 230 provides the first configuration. Based on the first configuration, a voltage level of the power input node NDC is equal to a voltage level of the high reference voltage VDDQ substantially. Therefore, when the setting signal SST has the first setting value VST1, the CA_ODT circuit 230 generates the power voltage VPWR based on the high reference voltage VDDQ.

When the setting signal SST has the second setting value VST2, the CA_ODT circuit 230 turns on the second switch SW2 and turns off the first switch SW1. Therefore, the CA_ODT circuit 230 provides the second configuration. Based on the second configuration, the voltage level of the power input node NDC is equal to a voltage level of the low reference voltage VSS substantially. Therefore, when the setting signal SST has the second setting value VST2, the CA_ODT circuit 230 generates the power voltage VPWR based on the low reference voltage VSS.

In some embodiments, the CA_ODT circuit 230 may provide a third configuration when turning on the first switch SW1 and turning on the second switch SW2 in response to other setting value of the setting signal SST. The resistors R1, R2 may divide the high reference voltage VDDQ to generate the power voltage VPWR having a voltage level different from the voltage level of the high reference voltage VDDQ and the voltage level of the low reference voltage VSS. In other words, based on the third configuration, the CA_ODT circuit 230 generates the power voltage VPWR having the voltage level lower than the voltage level of the high reference voltage VDDQ and higher than the voltage level of the low reference voltage VSS.

In the embodiment, each of the first switch SW1 and the second switch SW2 may be implemented by any type of transistor or a transmission gate.

In view of the foregoing, the voltage sensor senses the voltage level of the voltage setting command to generate the sensing signal. The convertor 120 sets the CA_ODT circuit in response to the sensing signal. The CA_ODT circuit provides the power voltage VPWR to the memory device. The voltage level of the power voltage corresponds to the voltage level of the voltage setting command. Therefore, the semiconductor device provides at least two different powers immediately and sequentially to the memory device based on the voltage level of the voltage setting command. Besides, the semiconductor device provides the power voltage to the memory device through the CA_ODT circuit. Therefore, a design and a process of the memory device does not need to be changed. The semiconductor device performs some operations of the memory device based on at least two power voltages at different time through the CA_ODT circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device for a memory device, comprising:
   a voltage sensor, configured to receive a voltage setting command, and sense a voltage level of the voltage setting command to generate a sensing signal;
   a convertor, coupled to the voltage sensor, configured to generate a setting signal in response to the sensing signal; and
   a command/address on-die-termination (CA_ODT) circuit, coupled between the convertor and the memory device, configured to generate a power voltage for the memory device in response to the setting signal, wherein a voltage level of the power voltage corresponds to the voltage level of the voltage setting command.

2. The semiconductor device of claim 1, wherein:
   when the voltage level of the voltage setting command is a first voltage level, the CA_ODT circuit generates the power voltage as a high power voltage, and
   when the voltage level of the voltage setting command is a second voltage level, the CA_ODT circuit generates the power voltage as a low power voltage.

3. The semiconductor device of claim 1, wherein the voltage sensor comprises:
a comparator, configured to receive the voltage setting command and a reference voltage, and compare the voltage setting command with the reference voltage to generate the sensing signal.

4. The semiconductor device of claim 3, wherein:
when the voltage level of the voltage setting command is higher than the voltage level of the reference voltage, the comparator generates the sensing signal having a first sensing value, and
when the voltage level of the voltage setting command is lower than the voltage level of the reference voltage, the comparator generates the sensing signal having a second sensing value.

5. The semiconductor device of claim 1, wherein the voltage sensor comprises:
a comparator, configured to receive the voltage setting command, a first reference voltage and a second reference voltage, and compare the voltage setting command with the first reference voltage and the second reference voltage to generate the sensing signal.

6. The semiconductor device of claim 5, wherein:
a voltage level of the first reference voltage is higher than a voltage level of the second reference voltage,
when the voltage level of the voltage setting command is higher than the voltage level of the first reference voltage, the comparator generates the sensing signal having a first sensing value, and
when the voltage level of the voltage setting command is lower than the voltage level of the second reference voltage, the comparator generates the sensing signal having a second sensing value.

7. The semiconductor device of claim 1, wherein:
the convertor converts the sensing signal having a first sensing value to the setting signal having the first setting value, and
the convertor converts the sensing signal having a second sensing value to the setting signal having the second setting value.

8. The semiconductor device of claim 1, wherein the CA_ODT circuit is configured to:
provide a first configuration when the setting signal has a first setting value and generate the power voltage having a first voltage level based on the first configuration, and
provide a second configuration when the setting signal has a second setting value and generate the power voltage having a second voltage level based on the second configuration.

9. The semiconductor device of claim 1, wherein the CA_ODT circuit comprises:
a first switch, wherein a first terminal of the first switch is coupled to a high reference voltage, a second terminal of the first switch is coupled to a power input node coupled to the memory device, and a control terminal of the first switch receives the setting signal; and
a second switch, wherein a first terminal of the second switch is coupled to the power input node, a second terminal of the second switch is coupled to a low reference voltage, and a control terminal of the second switch receives the setting signal.

10. The semiconductor device of claim 9, wherein:
when the setting signal has a first setting value, the CA_ODT circuit generates the power voltage based on the high reference voltage, and
when the setting signal has a second setting value, the CA_ODT circuit generates the power voltage based on the low reference voltage.

11. The semiconductor device of claim 9, wherein:
when the setting signal has a first setting value, the CA_ODT circuit turns on the first switch and turns off the second switch, and
when the setting signal has a second setting value, the CA_ODT circuit turns on the second switch and turns off the first switch.

* * * * *